(12) United States Patent
Lin et al.

(10) Patent No.: US 9,526,186 B2
(45) Date of Patent: Dec. 20, 2016

(54) STORAGE DEVICE AND PRODUCING METHOD OF THE SAME

(71) Applicant: PHISON ELECTRONICS CORP., Miaoli (TW)

(72) Inventors: Wei-Hung Lin, Hsinchu County (TW); Hung-I Chung, Hsinchu County (TW)

(73) Assignee: PHISON ELECTRONICS CORP., Miaoli (TW)

( * ) Notice: Subject to any disclaimer, the term of this patent is extended or adjusted under 35 U.S.C. 154(b) by 331 days.

(21) Appl. No.: 13/658,831

(22) Filed: Oct. 24, 2012

(65) Prior Publication Data
US 2014/0078662 A1 Mar. 20, 2014

(30) Foreign Application Priority Data
Sep. 18, 2012 (TW) .............................. 101134174 A

(51) Int. Cl.
*H05K 5/02* (2006.01)
(52) U.S. Cl.
CPC ........ *H05K 5/0278* (2013.01); *Y10T 29/49117* (2015.01)
(58) Field of Classification Search
CPC .... G06F 1/16; Y01T 29/49177; H05K 5/0278
USPC ........................................ 361/679.32, 679.4
See application file for complete search history.

(56) References Cited

U.S. PATENT DOCUMENTS

| | | | |
|---|---|---|---|
| 6,176,721 B1* | 1/2001 | Gottardo et al. ............. | 439/260 |
| 6,234,810 B1* | 5/2001 | Schnell et al. ............... | 439/76.1 |
| 6,343,945 B1* | 2/2002 | Liikanen ........................ | 439/160 |
| 6,908,038 B1* | 6/2005 | Le .................................. | 235/492 |
| 7,062,585 B2* | 6/2006 | Chen ............................. | 710/301 |
| D542,797 S  * | 5/2007 | Cuellar et al. ............... | D14/436 |
| 7,226,318 B1* | 6/2007 | Lee ................................ | 439/630 |
| 7,355,860 B2* | 4/2008 | Miller et al. .................. | 361/737 |
| 7,440,286 B2* | 10/2008 | Hiew et al. .................... | 361/737 |
| 7,540,786 B1* | 6/2009 | Koser .................. H01R 13/405 |  |
| | | | 439/660 |
| 7,575,481 B1* | 8/2009 | Liu ................................ | 439/660 |
| 7,632,151 B2* | 12/2009 | Wang et al. .................. | 439/630 |
| 8,061,608 B2* | 11/2011 | Liao et al. ..................... | 235/439 |
| 8,167,658 B1* | 5/2012 | Liu ....................... H01R 12/722 |  |
| | | | 439/630 |
| 2008/0096413 A1* | 4/2008 | Chen ............................. | 439/345 |
| 2009/0040710 A1* | 2/2009 | Chung ........................... | 361/684 |
| 2010/0100658 A1* | 4/2010 | Pignotti ........................ | 710/303 |
| 2010/0124847 A1* | 5/2010 | Shiu et al. ............... | 439/607.35 |

(Continued)

*Primary Examiner* — David M Sinclair
*Assistant Examiner* — Theron S Milliser
(74) *Attorney, Agent, or Firm* — Jianq Chyun IP Office

(57) ABSTRACT

A storage device including a housing, a connector, and a storage element is provided. The housing has an opening. The connector and the storage element are disposed in the housing. The connector has a main body, a first terminal set, and a second terminal set, the first and the second terminal sets disposed at opposite ends of the main body are electrically connected to each other correspondingly. The second terminal set is connected to an external device. The storage element has a plurality of pads. The first terminal set connects to the pads correspondingly, such that the connector is electrically connected to the storage element. The first terminal set and the pads are exposed out of the housing through the opening. A producing method of the storage device is also provided.

10 Claims, 11 Drawing Sheets

(56) References Cited

U.S. PATENT DOCUMENTS

2010/0267259 A1* 10/2010 Sun .............................. 439/131
2010/0317205 A1* 12/2010 Zhao et al. .................. 439/136
2014/0256164 A1* 9/2014 Lin .............................. 439/76.1

* cited by examiner

STORAGE DEVICE AND PRODUCING METHOD OF THE SAME

CROSS-REFERENCE TO RELATED APPLICATION

This application claims the priority benefit of Taiwan application serial no. 101134174, filed on Sep. 18, 2012. The entirety of the above-mentioned patent application is hereby incorporated by reference herein and made a part of this specification.

BACKGROUND

Field of the Invention

The present invention is directed to a storage device and a producing method of the same and specifically, to a flash drive and a producing method of the same.

Description of Related Art

With the development of multimedia technology, storage capacity required for digital data goes larger and larger. Conventional floppy disk in 1.44 MB features in its portable characteristic but still fails to meet the requirement of large storage capacity. Besides, although a conventional hard disk provides a large storage capacity, it still suffers in bulk size which leads to inconvenient carrying. Flash memory is one of the most adaptable memories for such battery-powered portable products due to its characteristics such as data non-volatility, low power consumption, small volume, and non-mechanical structure. A flash drive is a storage device which uses a NAND flash memory as its storage medium.

In general, a flash drive includes a circuit board, an electronic element, a storage circuit element, and a plurality of elastic terminals and metal contacts (also referred to as a connector or a connect interface) used for connecting with a host. Although miniaturization of the circuit board can appropriately make the flash drive smaller, the volume of the flash drive is quite difficult for further reduction due to the size of the metal housing of the connector. Accordingly, how to reduce the bulk size and maintain the structure strength of the flash drive has become one of the major subjects in the industry.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

The present invention is directed to a storage device having better structure strength.

The present invention is directed to a producing method of a storage device having better production efficiency and applicability.

According to an exemplary embodiment of the present invention, a storage device including a housing, a connector and a storage element is provided. The housing has an opening. The connector is disposed in the housing and has a main body and a first terminal set and a second terminal set located at opposite ends of the main body. The first terminal set and the second terminal set are electrically connected with each other correspondingly. The second terminal set is adapted to electrically connect the external device. The storage element is disposed in the housing and has a plurality of pads. The first terminal set is correspondingly connected with the pads so that the connector is electrically connected with the storage element. The first terminal set and the pads are exposed out of the housing from the opening.

According to an exemplary embodiment of the present invention, a producing method of a storage device is provided. The storage device includes a housing, a connector and a storage element. The connector has a plurality of terminals. The storage element has a plurality of pads. The producing method of the storage device includes correspondingly connecting the terminals and the pads and assembling the connector and the storage element into the housing.

According to an exemplary embodiment of the present invention, a producing method of a storage device is provided. The producing method of the storage device includes providing a connection assembly comprising a housing and a connector assembled in the housing, wherein the housing has an opening, the connector has a plurality of terminals exposed out of the housing through the opening, assembling a storage element into the housing, enabling the storage element to be clipped between the connector and the housing, wherein the storage element has a plurality of pads exposed out of the housing through the opening, and soldering the terminals with the pads correspondingly through the opening so as to electronically connect the connector with the storage element.

To sum up, in the exemplary embodiments of the present invention, the storage device uses the housing to cover and block the storage element and the connector stacked with each other therein. Thus, by covering the storage element and the connector, the housing can provide sufficient protection and structure strength thereto. Further, the terminals and the pads exposed out of the housing through the opening, the production persons can solder the terminals with the pads accordingly to improve production efficiency and re-utilization for the storage device.

In order to make the aforementioned and other features and advantages of the present invention more comprehensible, several embodiments accompanied with figures are described in detail below.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

DESCRIPTION OF EMBODIMENTS

Figure 1:
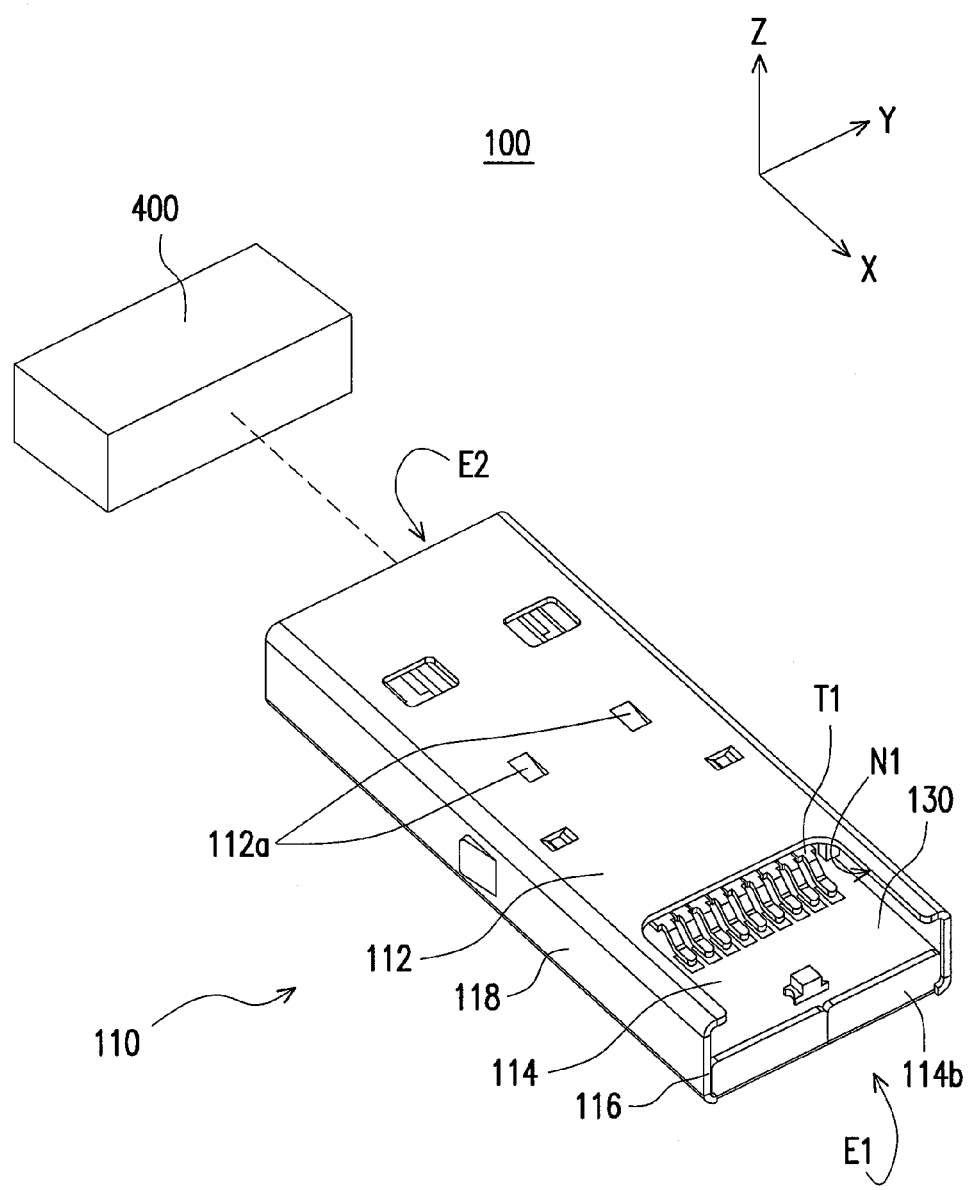
FIG. 1 is a schematic diagram illustrating a storage device according to an exemplary embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least on of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

Figure 2:
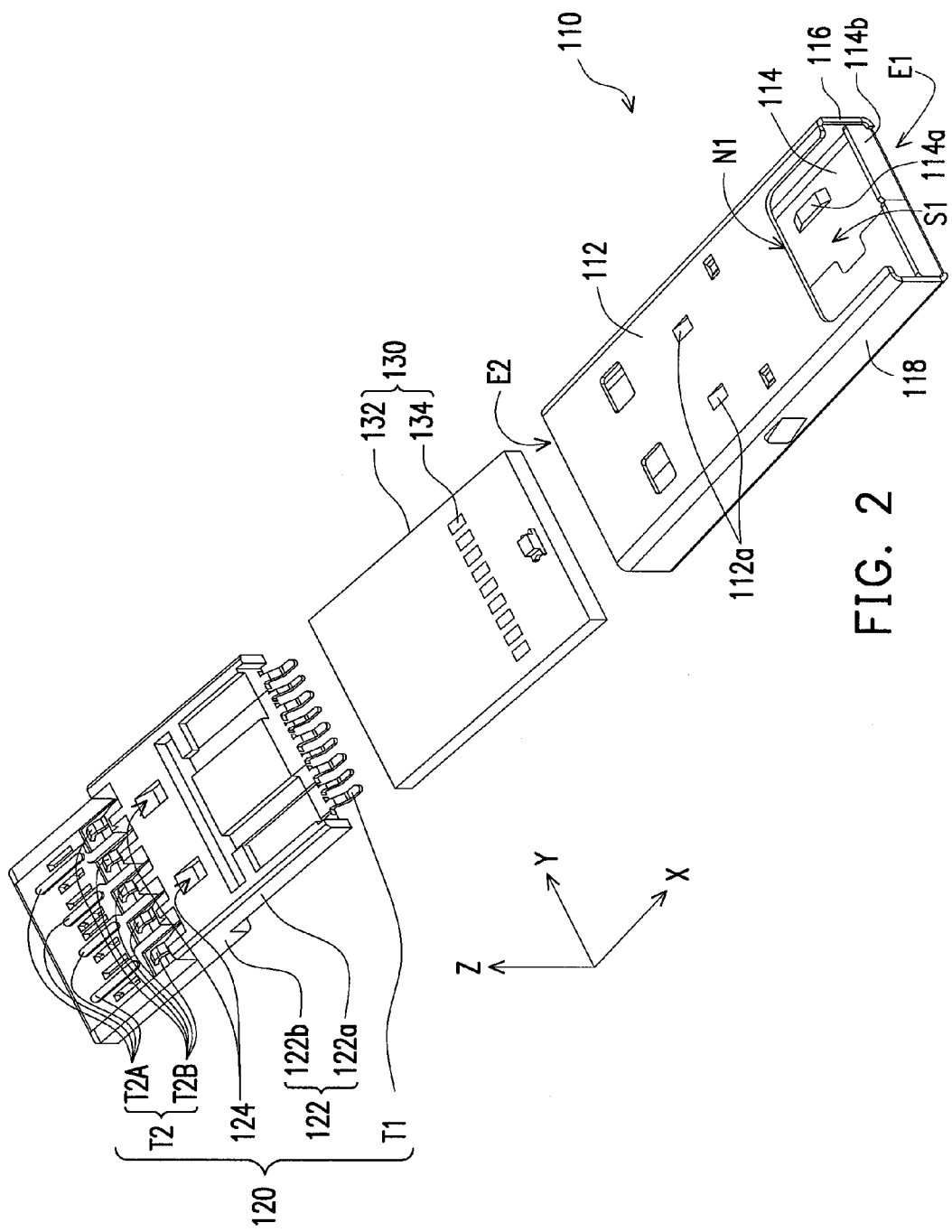
FIG. 2 is an exploded diagram illustrating the storage device of FIG. 1.

FIG. 1 is a schematic diagram illustrating a storage device according to an exemplary embodiment of the present invention. FIG. 2 is an exploded diagram illustrating the storage device of FIG. 1. Referring to FIG. 1 with FIG. 2, in the present exemplary embodiment, a storage device 100 includes a housing 110, a connector 120 and a storage element 130. The housing 110 is made of metal material and has a pair of gates E1 and E2 and an opening N1. The connector 120 and the storage element 130 are disposed in the housing 110. The connector 120 is a connector complying with the universal serial bus 3.0 (USB 3.0) standard, for example. The connector 120 has a main body 122 and a first terminal set T1 and a second terminal set T2 disposed at opposite ends of the main body 122. The number of terminals of the first terminal set T1 is equal to the number of terminals of the second terminal set, and the terminals of the first terminal set T1 and the terminals of the second terminal set T2 are electrically connected with each other correspondingly. The second terminal set T2 is configured to connect an external device 400. Furthermore, the second terminal set T2 includes a plurality of pad terminals T2A and a plurality of elastic terminals T2B. The pad terminals T2A are arranged along a Y axis (shown in FIG. 2) on the main body 122 and comply with the universal serial bus 2.0 (USB 2.0) standard. The elastic terminals T2B are an elastic structure, also arranged along the Y axis on the main body 122 and located between the pad terminals T2A and the first terminal set T1.

The USB 3.0 structure is formed by the pad terminals T2A and the elastic terminals T2B commonly.

In addition, a system in package (SIP) technology is employed to construct various types of electronic elements, such as a storage unit (e.g. a flash memory) and a control circuit, of the storage element 130 of the present exemplary embodiment into a systematic integrated package by the use of plastic, metal, ceramics material or epoxy resin, so as to protect the electronic elements in the package structure. The storage element 130 has a packaging body 132 and a plurality of pads 134. The pads 134 are exposed and located on the surface of the storage element 130. Accordingly, the connector 120 and the storage element 130 disposed in the housing 110 are soldered with each other by the first terminal set T1 and the pads 134 and exposed out of the housing 110 through an opening N1.

Therefore, the storage element 130 and the connector 120 of the present exemplary embodiment are covered by the housing 110 so as to effectively protect and support the storage element 130 and the connector 120. Thus, the storage element 130 and the connector 120 may still have durability while being miniaturized. Further, the first terminal set T1 and the pad 134 are exposed out of the housing 110 through the opening N1, and namely, the first terminal set T1 may be viewed by a user from top to bottom along the Z-axis direction illustrated in FIG. 2. Accordingly, the aforementioned method allows a production line operator not only to perform a soldering operation conveniently but also to perform de-soldering and dissembling operations during a reworking process, which contributes repair and re-utilization to the storage device 100.

Figure 3:
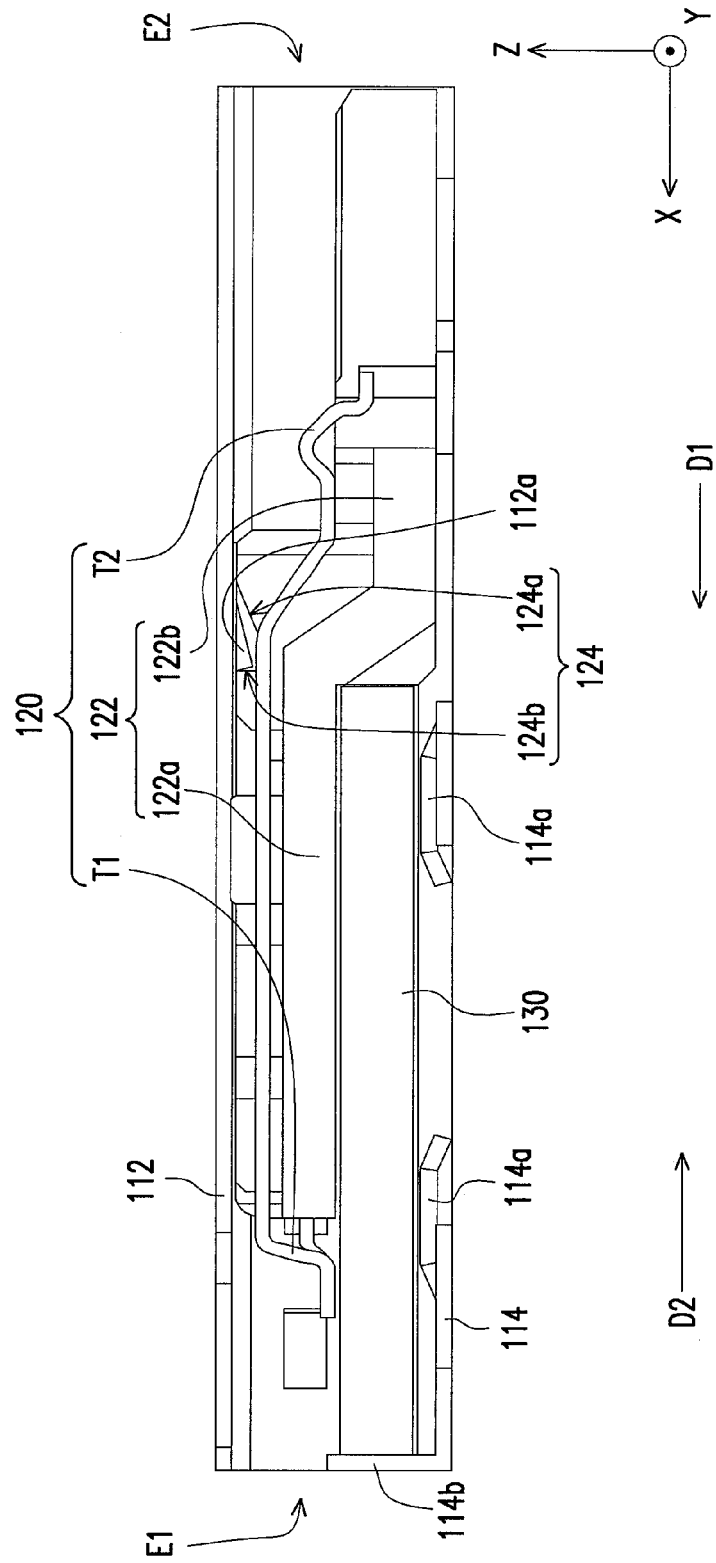
FIG. 3 is a sectional diagram illustrating the storage device of FIG. 1.

FIG. 3 is a sectional diagram illustrating the storage device of FIG. 1, where FIG. 1 is illustrated in a side viewing angle. Referring to FIG. 3 with FIG. 1, in the present exemplary embodiment, the housing 110 includes a top plate 112, a bottom plate 114 and a pair of side plates 116 and 118, which are used to construct a space S1 for containing the storage element 130 and the connector 120 and the aforementioned gates E1 and E2. Therein, the gates E1 and E2 are located at opposite sides in the containing space S1, wherein the opposite sides are different from the side plates 116 and 118. In other words, the storage element 130 and the connector 120 moved into the housing 110 through the gate E2 and embedded therein.

Additionally, the main body 122 of the connector 120 has a first supporting portion 122a and a second supporting portion 122b. The first supporting portion 122a is exposed out of the housing 110 through the gate E1 and leans against the top plate 112, and the second supporting portion 122b is exposed out of the housing 110 through the gate E2 and leans against the bottom plate 114, so that the main body 122 is presented in a ladder-like structure. Further, the user may view the second supporting portion 122b from the right to the left and view the first supporting portion 122a from the left to the right along an X axis shown in FIG. 3. Certainly, the first supporting portion 122a of the present exemplary embodiment is also exposed out of the housing 110 through the opening N1 even though the user may view the first supporting portion 122a from top to bottom along a Z axis shown in FIG. 2.

The first terminal set T1 is disposed on the first supporting portion 122a, and the second terminal set T2 is disposed on the second supporting portion 122b. When the connector 120 and the storage element 130 are embedded into the housing 110, the storage element 130 leans between first supporting portion 122a and the bottom plate 114, so that the pads 134 on the packaging body 132 are connected with the terminals of the first terminal set T1 correspondingly. As such, by the ladder-like structure, the storage element 130 leans against the first supporting portion 122a, so that the storage element 130 partially overlaps the main body 122 of the connector 120 and binds the outer portion of the main body 122 and the storage element 130 by the housing 110. Thus, the storage element 130 and the connector 120 may be effectively assembled and blocked with each other along the thickness direction (i.e. the Z axis direction) of the storage device 100.

In addition, in the present exemplary embodiment, the bottom plate 114 of the housing 110 has a plurality of protrusions 114a toward the top plate 112, which is formed by, for example, punching when manufacturing the housing 110. When the storage element 130 is disposed in the housing 110, the protrusions 114a lean against the storage element 130 so as to provide a supporting-up force, so that the storage element 130, the first supporting portion 122a and the top plate 112 are stacked with one another tightly. The present invention is not intent to limit the type and the disposing position of the protrusions 114a. In another exemplary embodiment that is not shown, the protrusions may be disposed on the top plate so as to provide a pushing-down force and also lean against the first supporting portion or the second supporting portion of the connector. In other words, by the structure features of the housing 110, the binding force to storage element 130 and the connector 120 may be increased. In yet another exemplary embodiment that is not shown, the designer may combine the housing, the storage element and the connector with tolerance fit of thickness of the containing space of the housing, the storage element and the connector.

On the other hand, in the present exemplary embodiment, the bottom plate 114 also has a stopping portion 114b which extends toward the top plate 112 and is located at the gate E1. The stopping portion 114b is formed, for example, by bending the bottom plate 114 toward the top plate 112 while manufacturing the housing 110. As such, the storage element 130 and the connector 120 are only allowed to move into the containing space S1 along the X axis only through the gate E2. Then, the storage element 130 and the connector 120 are stopped from moving along the X axis by the interference of the storage element 130 with the stopping portion 114b. Thereby, the storage element 130 and the connector 120 are positioned relative to the housing 110.

Further, referring to FIG. 3 with FIG. 2, the top plate 112 of the present exemplary embodiment has a blocking point 112a. The blocking point 112a is a protrusion structure formed by, for example, punching the top plate 112 and further bended toward the containing space S1 when manufacturing the housing 110. Correspondingly, the connector 120 also has a notch 124 located on the first supporting portion 122a with the back facing the storage element 130. It is to be mentioned that in the present exemplary embodiment, the stopping portion 114b is located at the gate E1 for both the storage element 130 and the connector 120 to be embedded into the housing 110 through the gate E2 along a direction D1. Here, the blocking point 112a extends from the gate E2 toward the gate E1, and the notch 124 has a forward-direction incline 124a and a stopping surface 124b, as shown in FIG. 3.

Thus, with the blocking point 112a and the forward-direction incline 124a, the storage element 130 and the connector 120 may be successfully slid into the containing space S1. While the storage element 130 is stopped by the stopping portion 114b, the blocking point 112a is also interfered with the stopping surface 124b, so that the connector 120 is stopped from ejecting from the containing space S1 along a direction D2. Thereby, with the related disposition of the blocking point 112a, the notch 124 and the stopping portion 114b, the storage element 130 and the connector 120 may be stably blocked in the housing 110. Therein, the directions D1 and D2 are opposite to each other.

Figure 4:
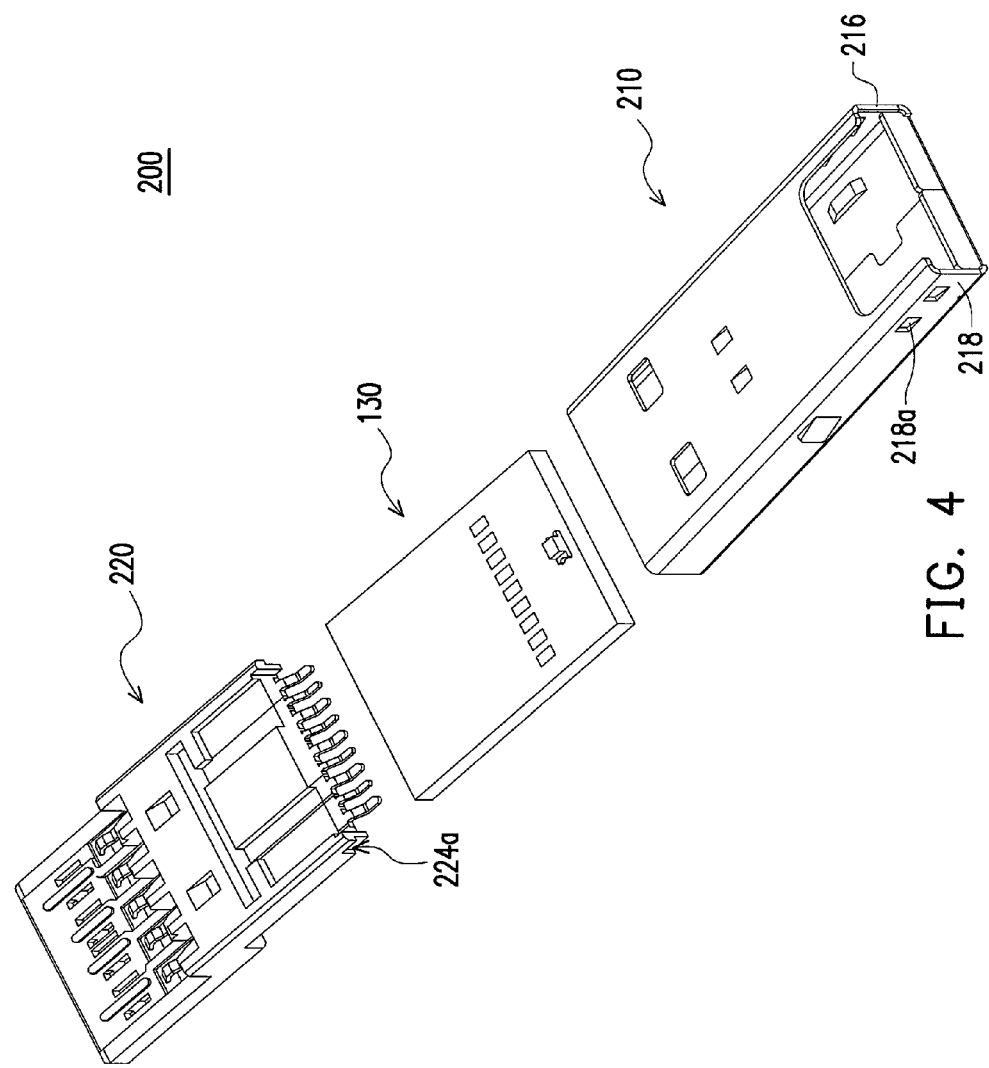
FIG. 4 is a schematic diagram illustrating of assembling a storage device according to another exemplary embodiment of the present invention.
Figure 5:
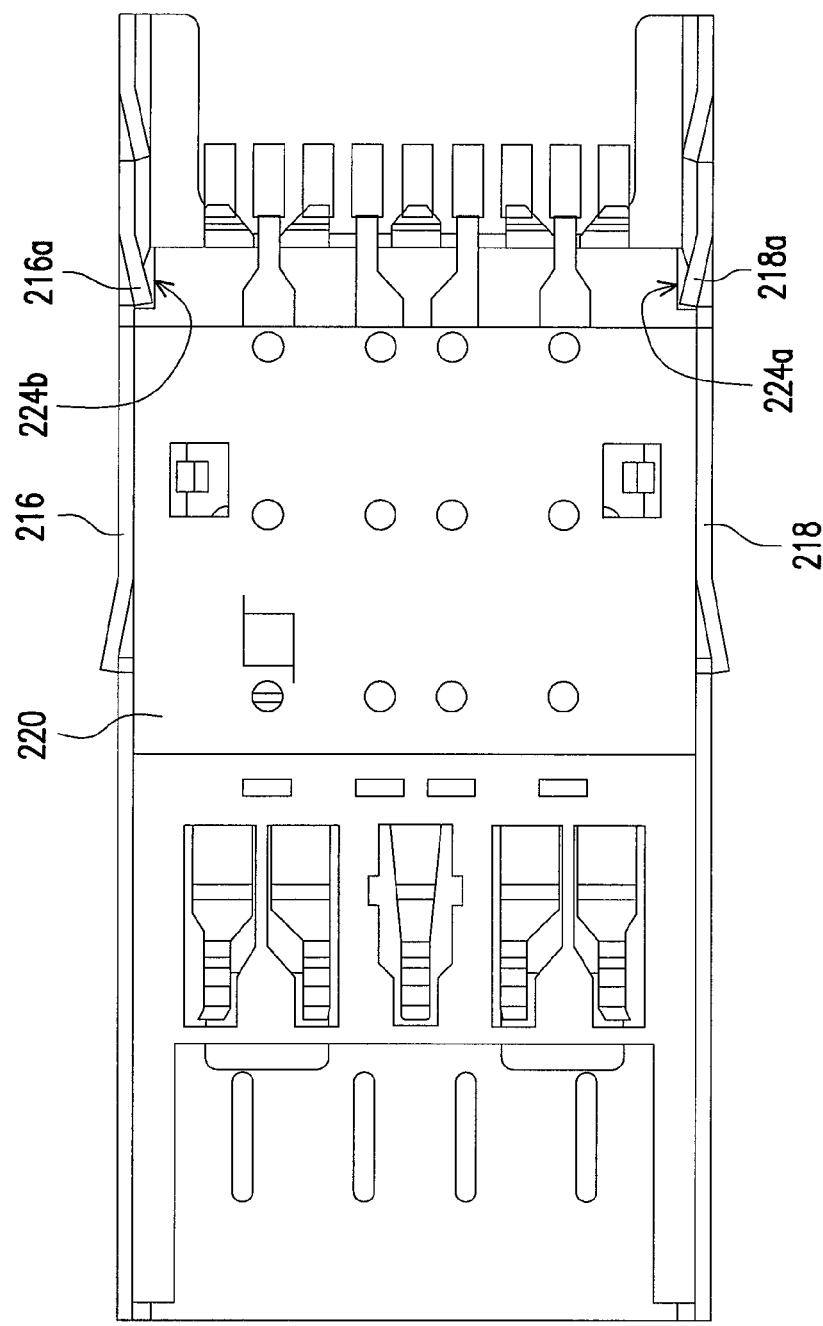
FIG. 5 is a sectional diagram illustrating the assembled storage device of FIG. 4.

FIG. 4 is a schematic diagram illustrating of assembling a storage device according to another exemplary embodiment of the present invention. FIG. 5 is a sectional diagram illustrating the assembled storage device of FIG. 4. FIG. 5 illustrates FIG. 1 in a bottom viewing angle and only a portion of elements illustrated therein. Referring to FIG. 4 with FIG. 5, in a storage device 200 of the present exemplary embodiment, includes a housing 210. The housing 210 includes side plates 216 and 218, which have blocking points 216a and 218a, respectively. The storage device 200 also includes a connector 220 having notches 224a and 224b located at opposite ends of the main body 222, which correspond to the blocking points 216a and 218a, respectively.

Accordingly, when the connector 220 is moved into the housing 210, the connector 220 and the housing 210 are properly positioned and blocked by interfering the blocking points 216a and 218a with the notches 224a and 224b so as to prevent the connector 220 from moving out of the housing 210.

Based on the above, even though the related stopping and positioning structures of the storage device of the present invention are illustrated in different exemplary embodiments, the present invention is not limited thereto. In another exemplary embodiment that is not shown, the stopping portion, the structures of the blocking points and the notches may be adopted in the same storage device at the same time. Namely, any related structures or means that can be used for blocking the housing, the storage element and the connector may be applied or implemented in the exemplary embodiments of the present invention according to usage requirements or environments of the storage device.

Figure 6:
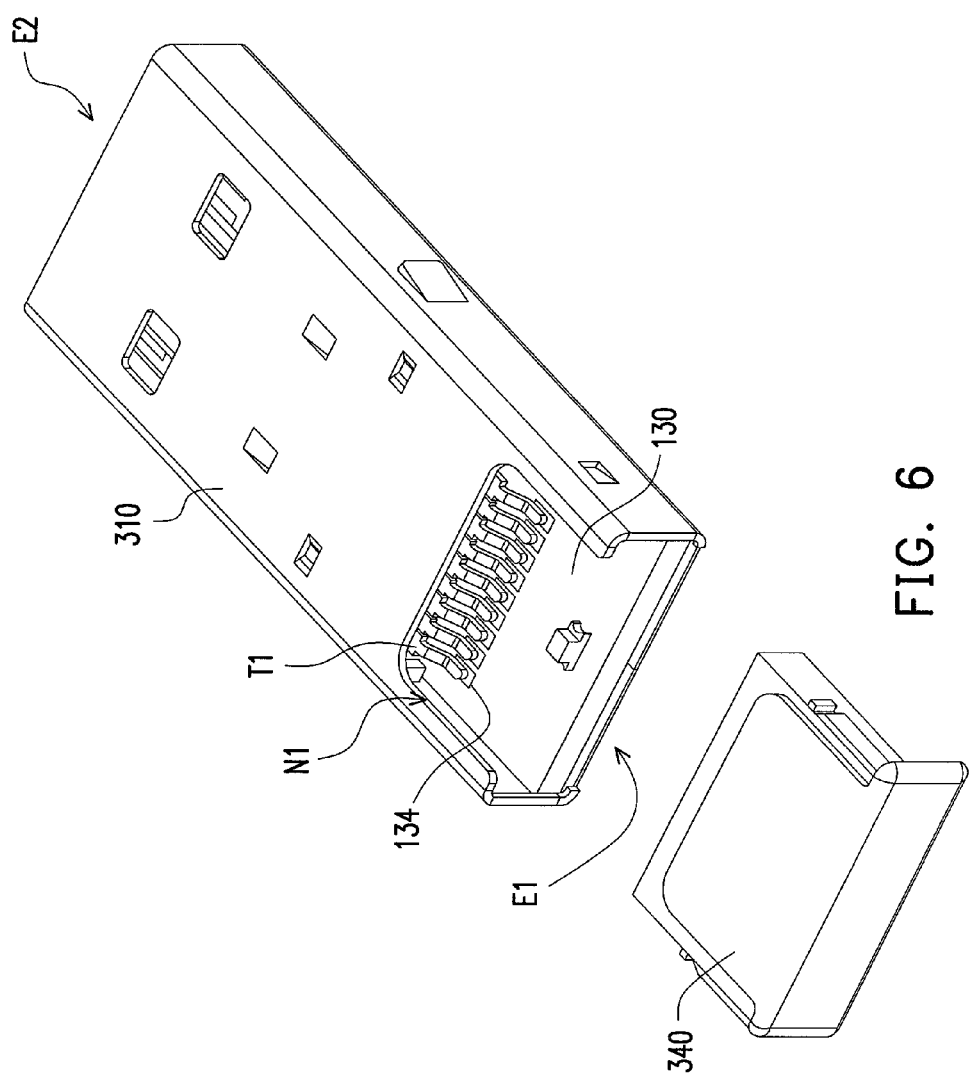
FIG. 6 and FIG. 7 are schematic diagrams illustrating a storage device according yet another exemplary embodiment of the present invention.
Figure 7:
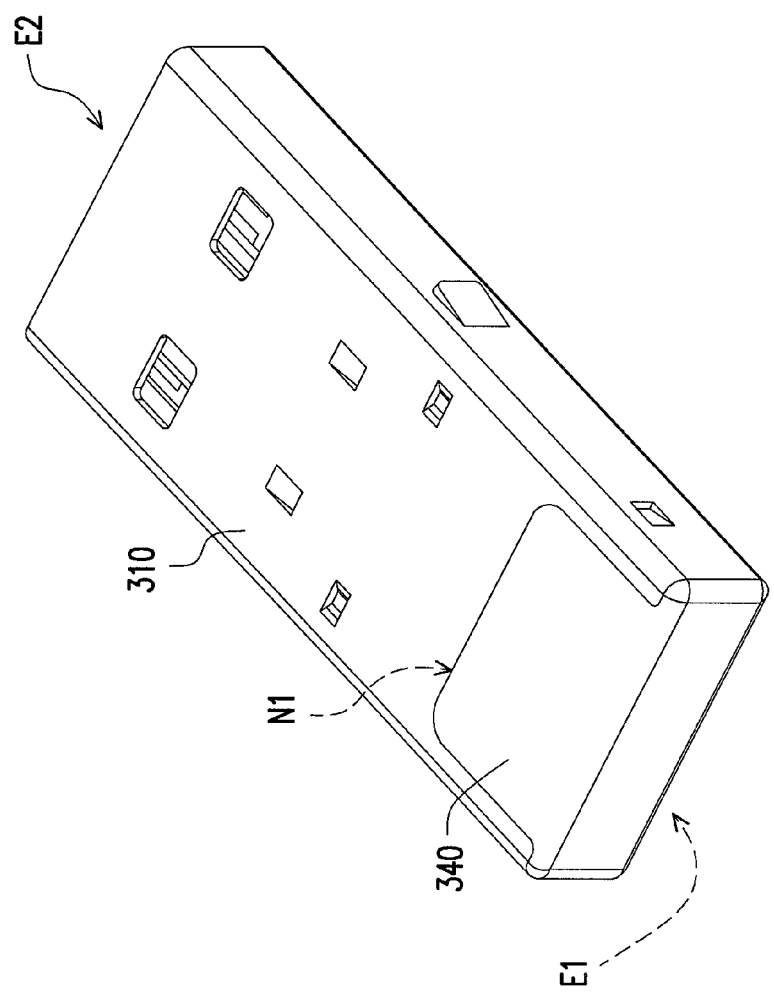

FIG. 6 and FIG. 7 are schematic diagrams illustrating a storage device according yet another exemplary embodiment of the present invention. Therein, a portion of elements depicted in FIG. 6 is schematically illustrated in FIG. 7. With reference to FIG. 6 with FIG. 7, the present exemplary embodiment is different from the preceding exemplary embodiment in providing no stopping portion 114b. In other words, the storage element 130 and the connector 120 may be embedded in to a housing 310 through the gate E1 or the gate E2. Additionally, a storage device 300 further includes a cover body 340 which is assembled to the housing 310 and covers the gate E1. It is to be mentioned that in the present exemplary embodiment, the opening N1 is located at the gate E1 and opposite to the second terminal set T2 located at the gate E2, and thus, when the cover body 340 is assembled to the housing 310, the gate E1 and the opening N1 are covered at the same time. Thereby, the stopping structure for the storage element 130 and the connector 120 are formed and the soldered structures (such as the pads 134 and the first terminal set T1) in the housing are further protected.

Figure 8:
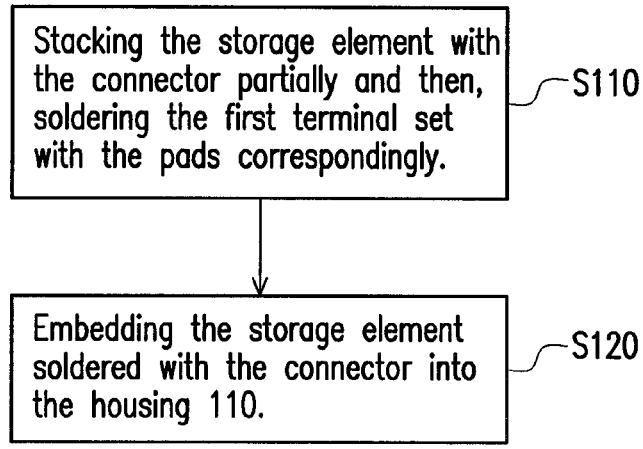
FIG. 8 is a flowchart of manufacturing a storage device according to an exemplary embodiment of the present invention.

FIG. 8 is a flowchart of manufacturing a storage device according to an exemplary embodiment of the present invention. Referring to FIG. 8 with FIG. 2, in step S110 of the present exemplary embodiment, the storage element 130 is stacked with the connector 120 partially and then, the first terminal set T1 are soldered with the pads 134 correspondingly. Then, in step S120, the storage element 130 soldered with the connector 120 is embedded into the housing 110. At this time, the storage element 130 is stopped by the stopping portion 114b of the housing 110 and the storage element 130 and the connector 120 are covered by the housing 110. In the meantime, the storage element 130 and the connector 120 are fixed by the protrusions, the blocking points and the notches.

Figure 9:
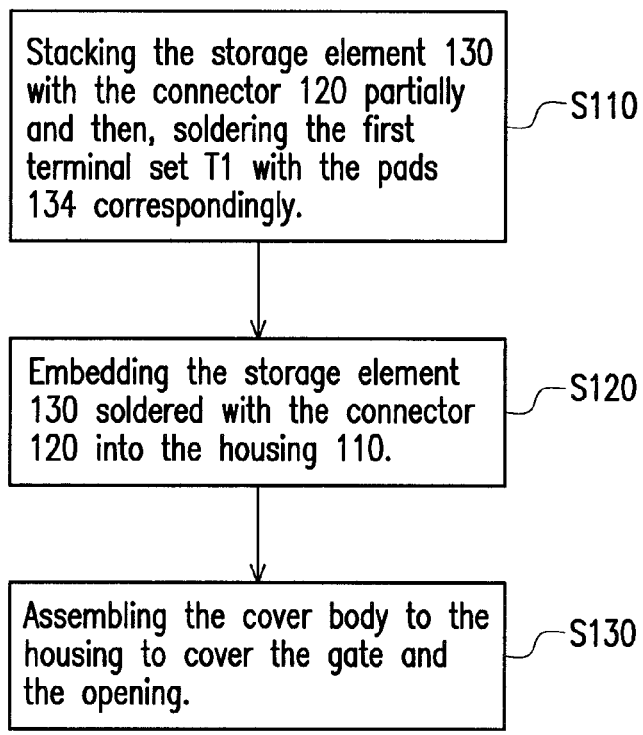
FIG. 9 is a flowchart of manufacturing a storage device according to another exemplary embodiment of the present invention.

FIG. 9 is a flowchart of manufacturing a storage device according to another exemplary embodiment of the present invention. Referring to FIG. 9 with FIG. 7, differing from FIG. 8, the stopping portion 114b is not provided in the present exemplary embodiment. Thus, beside the aforementioned steps S110 and S120, step S130 is further included, where the cover body 340 is assembled to the housing 310 to cover the gate E1 and the opening.

Figure 10:
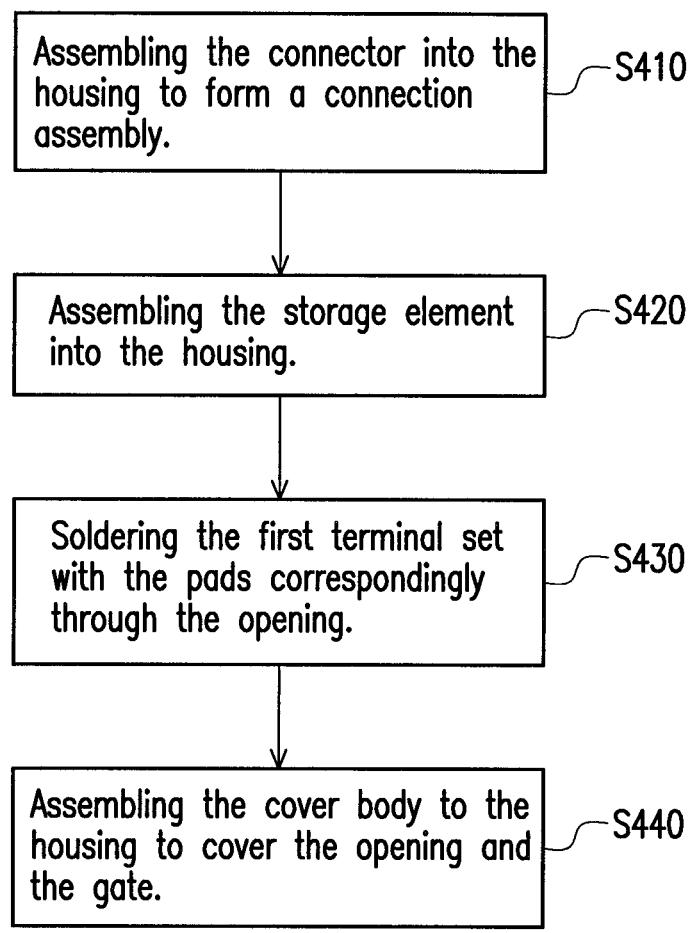
FIG. 10 is a flowchart of manufacturing a storage device according to yet another exemplary embodiment of the present invention.
Figure 11:
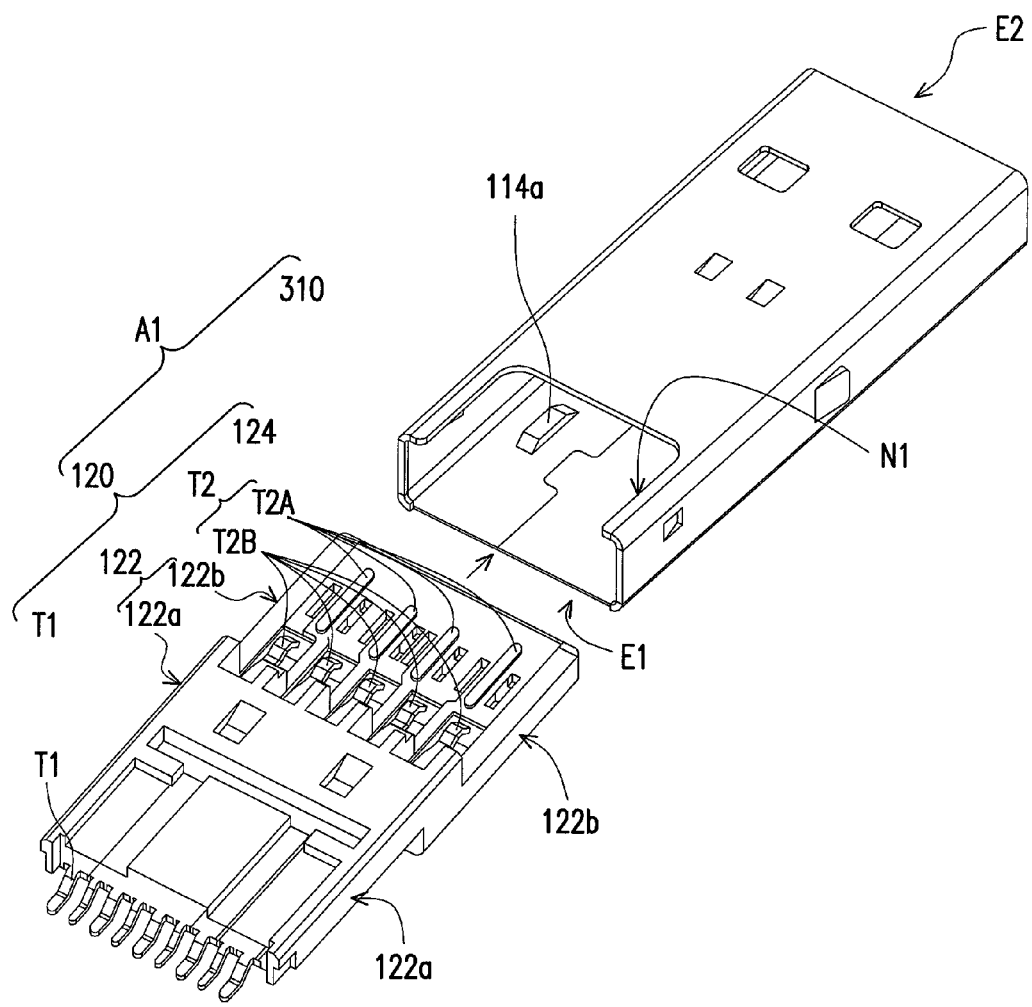
FIG. 11 and FIG. 12 are schematic diagrams illustrating the manufacturing process of the storage device of FIG. 10.
Figure 12:
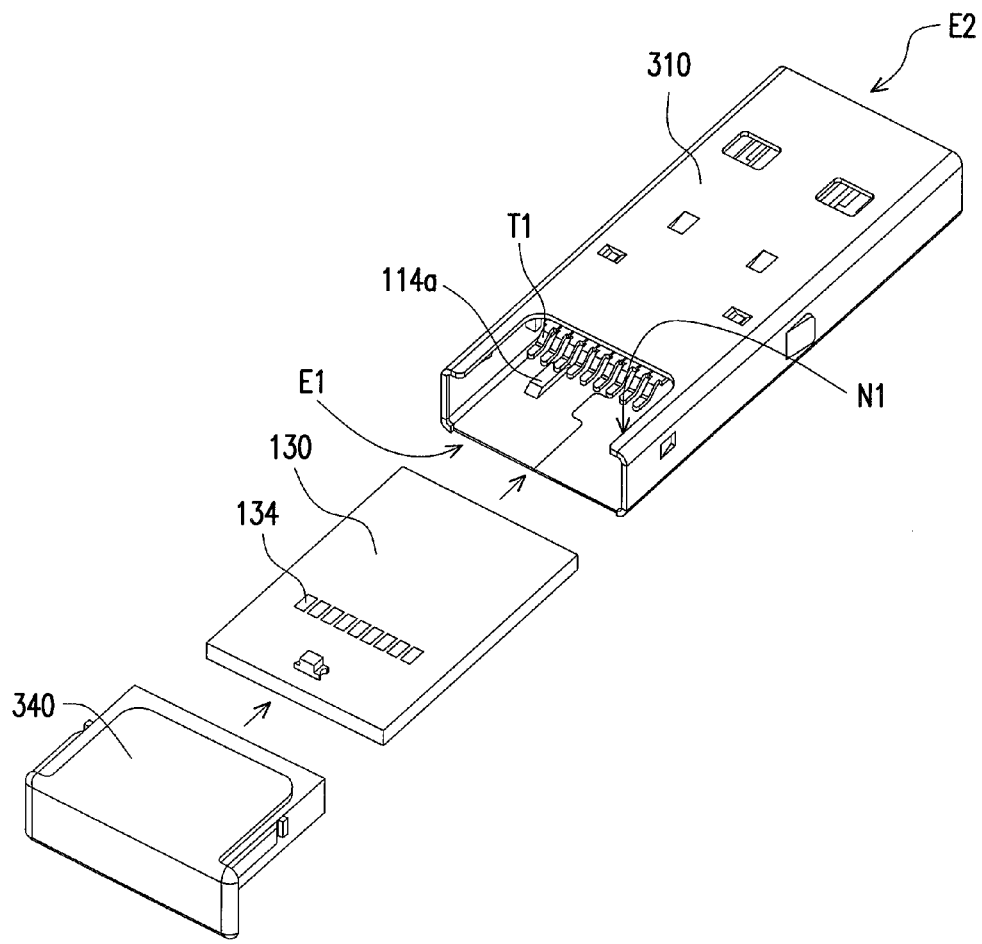

FIG. 10 is a flowchart of manufacturing a storage device according to yet another exemplary embodiment of the present invention FIG. 11 and FIG. 12 are schematic diagrams illustrating the manufacturing process of the storage device of FIG. 10. Referring to FIG. 10 through FIG. 12, differing from the above, in step S410, the connector 120 is assembled into the housing 310 to form a connection assembly A1. Then, in step S420, the storage element 130 is assembled into the housing 310, so that the storage element 130 is clipped between the first supporting portion 122a of the connector 120 and the protrusion 114a of the housing 310, and the first terminal set T1 of the connector 120 and the pads 134 of the storage element 130 are all exposed out of the housing 310 through the opening N1.

It should be noticed that the connector 120 may be moved into the housing 310 from the gate E1 or E2. However, when assembling the storage element 130, only the gate E1 of the housing 310 is left for moving the storage element 130 in. Then, in step S430, the first terminal set T1 is correspondingly soldered with the pads 134 through the opening N1. Finally, in step S440, the cover body 340 is assembled to the housing 310 to cover the opening N1 and the gate E1.

Based on the above, in the embodiments of the present invention, the storage device uses the housing to cover and block the storage element stacked with the connector therein, so that the storage element and the connector are covered by the housing so as to provide better strength for the structure.

Moreover, the first terminal set and the pads of the storage device exposed out of the housing through the opening not only contributes to the soldering process of the production line but also enable the reworking process to be performed on the storage device easily, and thus, the manufacturing process of the storage device is provided with better applicability. Accordingly, a manufacturing method can be selected according to manufacturing requirements and efficiency without limiting the assembly sequence. The previously described exemplary embodiments of the present invention have the advantages aforementioned, wherein the advantages aforementioned not required in all versions of the present invention.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A storage device, comprising:
   a housing, having an opening, wherein the housing comprises:
      a bottom plate;
      a top plate, having the opening, wherein the opening extends from a rear of the housing into a top surface of the top plate; and
      a pair of side plates, each of which is connected between the bottom plate and the top plate and opposite to each other;
   a connector, disposed in the housing and having a main body, a first terminal set, a plurality of pad terminals, and a plurality of elastic terminals,
   wherein the pad terminals and the elastic terminals are disposed at a first end of the main body, the first terminal set is disposed at a second end opposite to the first end of the main body, and the pad terminals and the elastic terminals are electrically connected with the first terminal set correspondingly,
   wherein the main body has a first supporting portion and a second supporting portion, the first terminal set is disposed on the first supporting portion, the pad terminals and the elastic terminals are disposed on the second supporting portion,
   wherein the pad terminals and the elastic terminals are for electrically connecting an external device, the pad terminals and the elastic terminals are electrically independent from each other, and the elastic terminals are covered by the top plate,
   wherein the pad terminals are integrally formed with a portion of terminals of the first terminal set respectively, and the elastic terminals are integrally formed with another portion of terminals of the first terminal set respectively; and
   a storage element, disposed in the housing and having a plurality of pads, wherein the first terminal set is connected with the pads correspondingly to enable the connector to be electrically connected with the storage element, and the first terminal set and the pads are exposed out of the housing through the opening, wherein the bottom plate has at least one protrusion toward the top plate, and the protrusion leans against the storage element.

2. The storage device according to claim 1, wherein a containing space and a pair of gates are formed by the bottom plate, the top plate and the pair of side plates, the first supporting portion is exposed out of the housing through one of the pair of gates, the second supporting portion is exposed out of the housing through the other one of the pair of gates, and the storage element and the connector are blocked in the containing space.

3. The storage device according to claim 2, wherein the bottom plate further has a stopping portion extending toward the top plate and located on at least one of the pair of gates.

4. The storage device according to claim 2, wherein the top plate further has a first blocking point inserted and blocked in a first notch of the connector.

5. The storage device according to claim 2, wherein each of the side plates has a second blocking point inserted and blocked in a second notch of the connector.

6. The storage device according to claim 2, wherein the storage device further comprises:
   a cover body, assembled to the housing and covering one of the pair of gates.

7. The storage device according to claim 6, wherein the cover body covers the opening.

8. The storage device according to claim 2, wherein the first supporting portion leans against the top plate and the second supporting portion leans against the bottom plate so as to enable the main body to be presented in a ladder-like structure, and the storage element leans between the first supporting portion and the bottom plate.

9. The storage device according to claim 1, wherein the connector is a connector for a first serial bus.

10. The storage device according to claim 9, wherein the plurality of pad terminals are arranged along an axis on the main body and configured for a second serial bus; and
the plurality of elastic terminals are arranged along the axis on the main body and located between the pad terminals and the first terminal set,
wherein the connector for the first serial bus-is formed by the pad terminals and the elastic terminals.

\* \* \* \* \*